(12) United States Patent
Wong

(10) Patent No.: US 6,317,349 B1
(45) Date of Patent: Nov. 13, 2001

(54) NON-VOLATILE CONTENT ADDRESSABLE MEMORY

(75) Inventor: Sau-ching Wong, Hillsborough, CA (US)

(73) Assignee: Sandisk Corporation, Sunnyvale, CA (US)

( * ) Notice: Subject to any disclaimer, the term of this patent is extended or adjusted under 35 U.S.C. 154(b) by 0 days.

(21) Appl. No.: 09/293,134

(22) Filed: Apr. 16, 1999

(51) Int. Cl.[7] .................................................. G11C 15/00
(52) U.S. Cl. .................... 365/49; 365/185.05; 365/185.1
(58) Field of Search ............................... 365/49, 185.07, 365/185.05, 185.06, 185.1

(56) References Cited

U.S. PATENT DOCUMENTS

| | | | |
|---|---|---|---|
| 4,538,243 | 8/1985 | Zehner | 365/49 |
| 4,833,643 | 5/1989 | Hori | 365/49 |
| 4,890,260 | 12/1989 | Chuang et al. | 365/49 |
| 4,928,260 | 5/1990 | Chuang et al. | 365/49 |
| 5,034,919 | 7/1991 | Sasai et al. | 365/49 |
| 5,040,134 | 8/1991 | Park | 364/602 |
| 5,051,949 | 9/1991 | Young | 365/49 |
| 5,111,427 | 5/1992 | Kobayashi et al. | 365/49 |
| 5,226,005 | 7/1993 | Lee et al. | 365/49 |
| 5,258,946 | 11/1993 | Graf | 365/49 |
| 5,267,213 | 11/1993 | Sung et al. | 365/226 |
| 5,305,262 | 4/1994 | Yoneda | 365/189.05 |
| 5,383,146 | 1/1995 | Threewitt | 365/49 |
| 5,386,379 | 1/1995 | Ali-Yahia et al. | 365/49 |
| 5,396,449 | 3/1995 | Atallah et al. | 365/49 |
| 5,453,948 | 9/1995 | Yoneda | 365/49 |
| 5,455,784 | 10/1995 | Yamada | 365/49 |
| 5,568,415 | 10/1996 | McLellan et al. | 365/49 |
| 5,619,446 | 4/1997 | Yoneda et al. | 365/49 |

(List continued on next page.)

OTHER PUBLICATIONS

Hanyu, T., et al., "Design of a one-transistor-cell multiple-valued CAM," *IEEE Journal of Solid-State Circuits*, vol. 31, No. 11, Nov. 1996, pp. 1669–1674 (abstract only).

(List continued on next page.)

*Primary Examiner*—Vu A. Le
(74) *Attorney, Agent, or Firm*—Skjerven Morrill MacPherson, LLP

(57) ABSTRACT

A content addressable memory (CAM) includes non-volatile CAM cells that are in an array similar to a conventional Flash memory array. In the CAM, each word line connects to control gates of Flash memory cells in a row, each bit line connects to drains of Flash memory cells in a column, and each match line is a source line coupled to sources of Flash memory cells in a row. A 2-T CAM cell includes a pair of non-volatile devices coupled to the same word line and match line. Each non-volatile device can be a floating-gate transistor, a Flash memory cell, or a shared-floating-gate (SFG) device. An erase of a CAM word applies erase voltages to the word and match lines associated with the word. The erase does not depend on the bit line voltages. Accordingly, the CAM array can simultaneously perform a search and an erase. With SFG devices, the CAM array can also simultaneously perform a search and a program operation. A CAM buffer stores words to be written in the array and can also conducts a search during an erase so that the CAM can perform back-to-back write and search operations without waiting for completion of an erase operation. A dual CAM cell includes a combination of two CAM elements, each CAM cells being, for example, a known or new 2-T CAM cell. The first element stores a data bit of a CAM word. A second element is programmed to either represent the data bit or a "don't care" state. A search without masking uses the first element in each dual CAM cell, and a search with masking uses some or all of the second elements depending on a mask selection register. To change masking for a particular CAM word, the first element is read, and the second element is reprogrammed according to the value read and the desired masking.

17 Claims, 8 Drawing Sheets

U.S. PATENT DOCUMENTS

| | | | |
|---|---|---|---|
| 5,642,114 | 6/1997 | Komoto et al. | 341/67 |
| 5,787,458 | 7/1998 | Miwa | 711/108 |
| 5,828,593 | 10/1998 | Schultz et al. | 365/49 |
| 5,859,791 | 1/1999 | Schultz et al. | 365/49 |
| 5,890,201 | 3/1999 | McLellan et al. | 711/108 |
| 5,940,852 | 8/1999 | Rangasayee et al. | 711/108 |
| 5,949,696 | 9/1999 | Threewitt | 365/49 |

OTHER PUBLICATIONS

Hanyu, T., et al., "2–Transistor–Cell 4–Valued Universal–Literal CAM for a Cellular Logic Image Processor," *1997 IEEE International Solid–State Circuits Conference, Digest of Technical Papers*, First Edition, Feb. 1997, pp. 46–47 and 427.

Hanyu, T., et al., "One–transistor–cell 4–valued universal-literal CAM for cellular logic image processing," Proceedings of the 27th International Symposium on Multiple–Valued Logic, May 28–30, 1997, pp. 175–180 (abstract only).

Hanyu, T., et al., "Multiple–valued floating–gate–MOS pass logic and its application to logic–in–memory VLSI," Proceedings of the 28th IEEE International Symposium on Multiple–Valued Logic, May 27–29, 1998, pp. 270–275 (abstract only).

Jamil, T., "RAM versus CAM," *IEEE Potentials*, vol. 16, No. 2, Apr.–May 1997, pp. 26–29 (abstract only).

Kramer, A., et al., "55GCPS CAM Using 5b Analog Flash," *IEEE International Solid–State Circuits Conference, Digest of Technical Papers*, First Edition, Feb. 1997, pp. 44–45 and 427.

Miwa, T., et al., "A 1Mb 2–Transistor/bit Non–Volatile CAM Based on Flash–Memory Technologies," *1996 IEEE International Solid–State Circuits Conference, Digest of Technical Papers*, First Edition, Feb. 1996, pp. 40–41 and 414.

Miwa, T., et al., "A 1–Mb 2–Tr/b Nonvolatile CAM Based on Flash Memory Technologies," *IEEE Journal of Solid-State Circuits*, vol. 31, No. 11, Nov. 1996, pp. 1601–1609.

Schultz, K., and Gulak, P., "CAM–based single–chip shared buffer ATM switch," *IEEE International Conference on Communications*, May 1–5, 1994, pp. 1190–1195 (abstract only).

Schultz, K. and Gulak, P., "Fully–parallel multi–megabit integrated CAM/RAM design," *Records of the IEEE International Workshop on Memory Technology, Design and Testing*, Aug. 8–9, 1994, pp. 46–51 (abstract only).

Schultz, K. and Gulak, P., "Fully parallel integrated CAM/RAM using preclassification to enable large capacities," *IEEE Journal of Solid–State Circuits*, vol. 31, No. 5, May 1996, pp. 689–699 (abstract only).

Shafai, F., et al., "Fully parallel 30–MHz, 2.5–Mb CAM," *IEEE Journal of Solid–State Circuits*, vol. 33, No. 11, pp. 1690–1696 (abstract only).

Wade, J. and Sodini, C., "A Ternary Content Addressable Search Engine," *IEEE Journal of Solid–State Circuits*, vol. 24, No. 4, Aug. 1989, pp. 1003–1013.

Yamagata, T., et al., "A 288–kb Fully Parallel Content Addressable Memory Using a Stacked–Capacitor Cell Structure," *IEEE Journal of Solid–State Circuits*, vol. 27, No. 12, Dec. 1992, pp. 1927–1933.

Yamagata, T., et al., "A Bitline Control Circuit Scheme and Redundancy Technique for High–Density Dynamic Content Addressable Memories," *IEICE Transactions on Electronics*, vol. E76–C, No. 11, Nov. 1993, pp. 1657–1664.

Aragaki, S., et al., "A High–Density Multiple–Value Content–Addressable Memory Based on One Transistor Cel.," *IEICE Transactions on Electronics*, vol. E76–C, No. 11, Nov. 1993, pp. 1649–1656.

Ghose, K., "Response pipelined CAM chips: the first generation and beyond,"*Proceedings of the 7th International Conference on VLSI Design*, Jan. 5–8, 1994, pp. 365–368 (abstract only).

Glaise, R. and Munier, J., "A low cost searching device for an ATM adapter," *Proceedings of the 6th International Conference on Computer Communications and Networks*, Sep. 22–25, 1997, pp. 488–493 (abstract only).

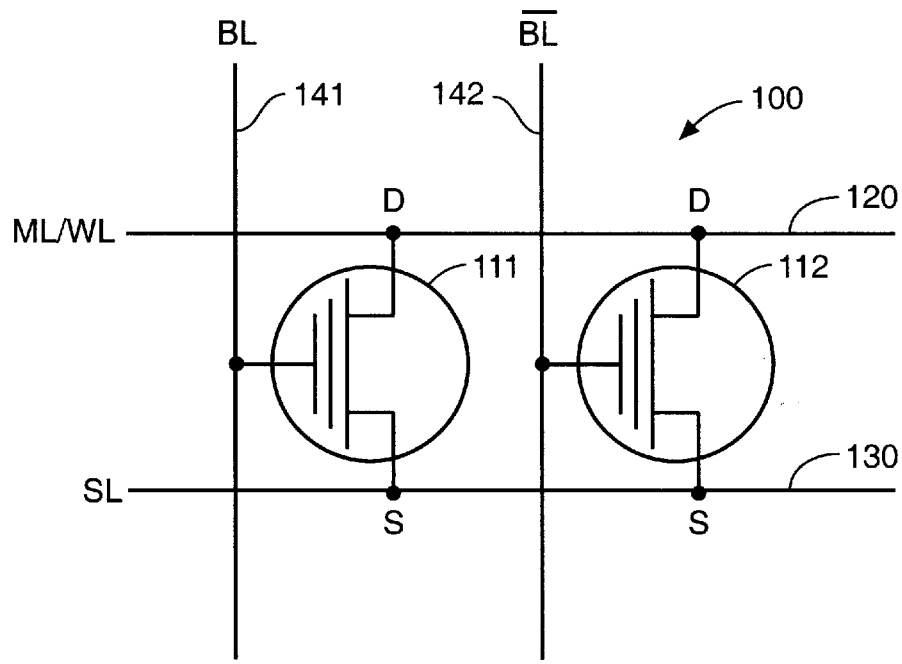
FIG._1
(PRIOR ART)
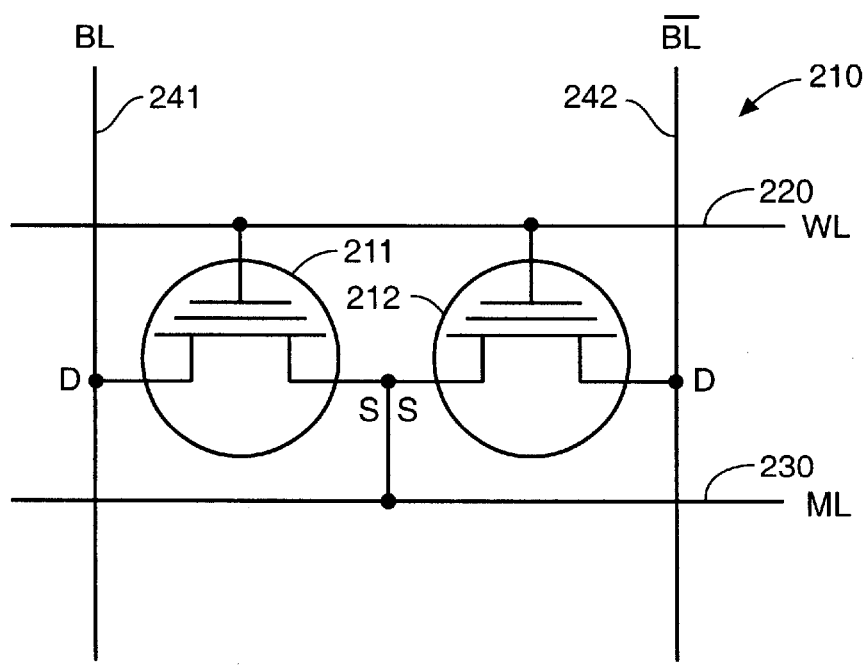
FIG._2

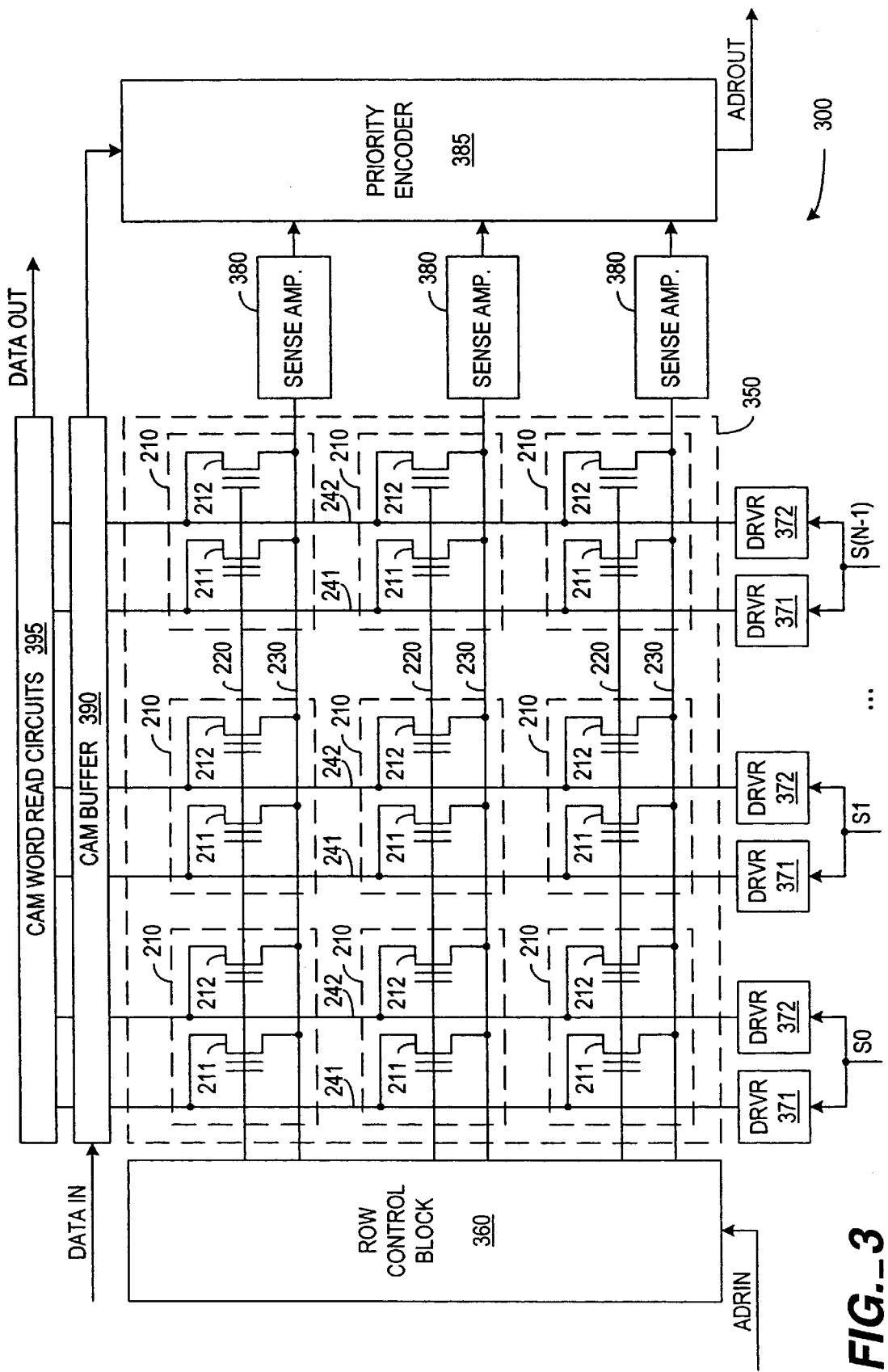
FIG._3

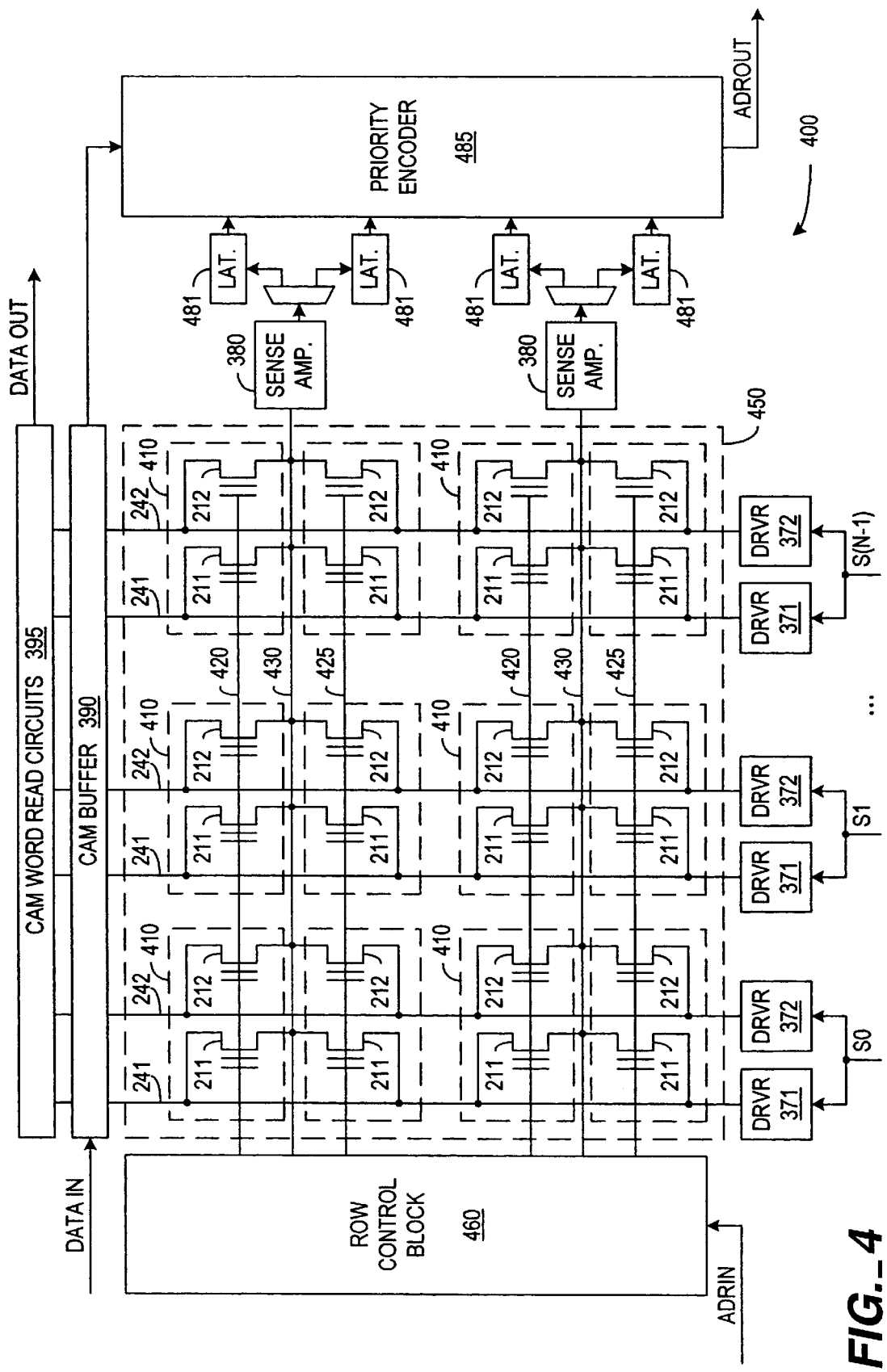
FIG._4

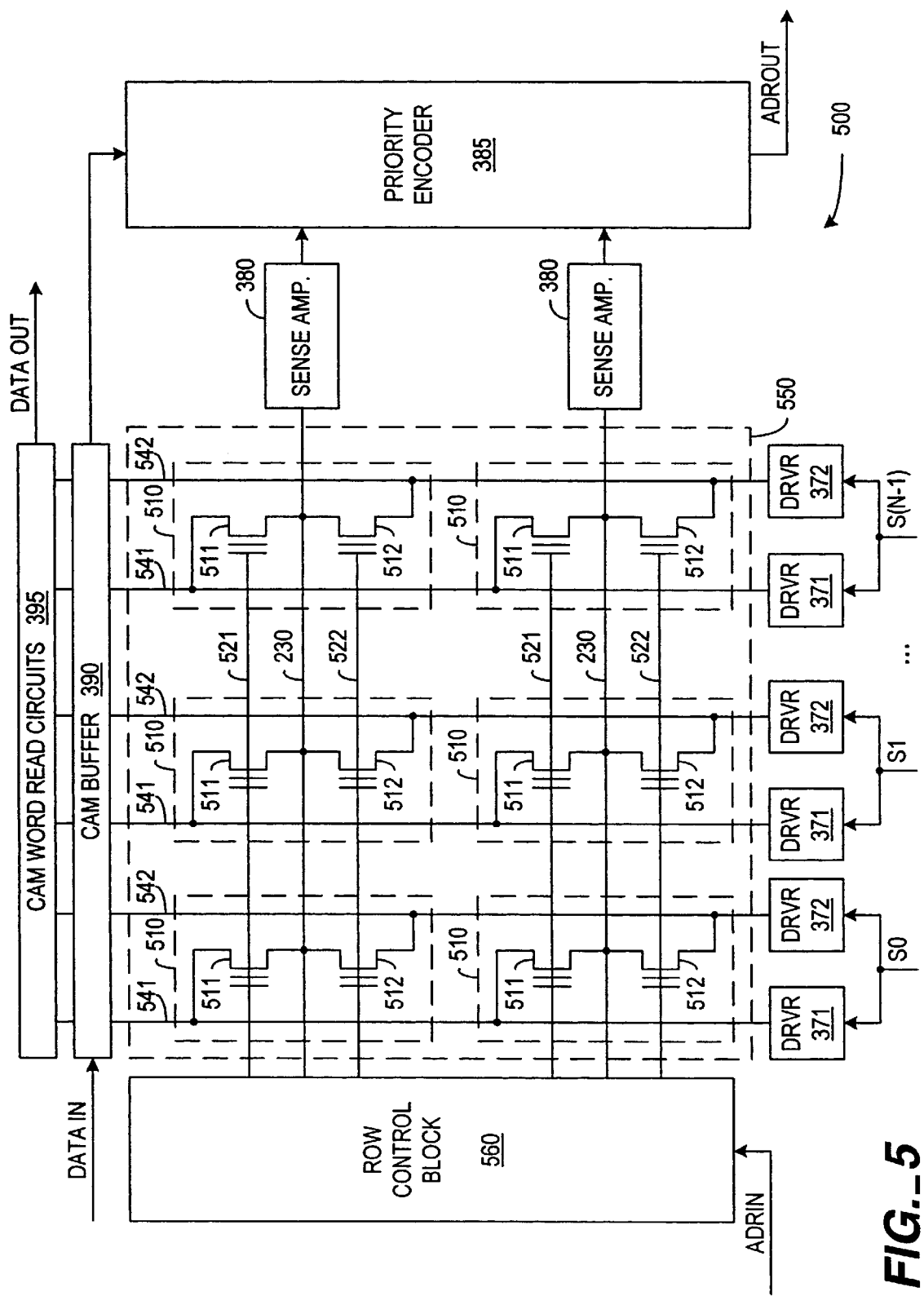
FIG._5

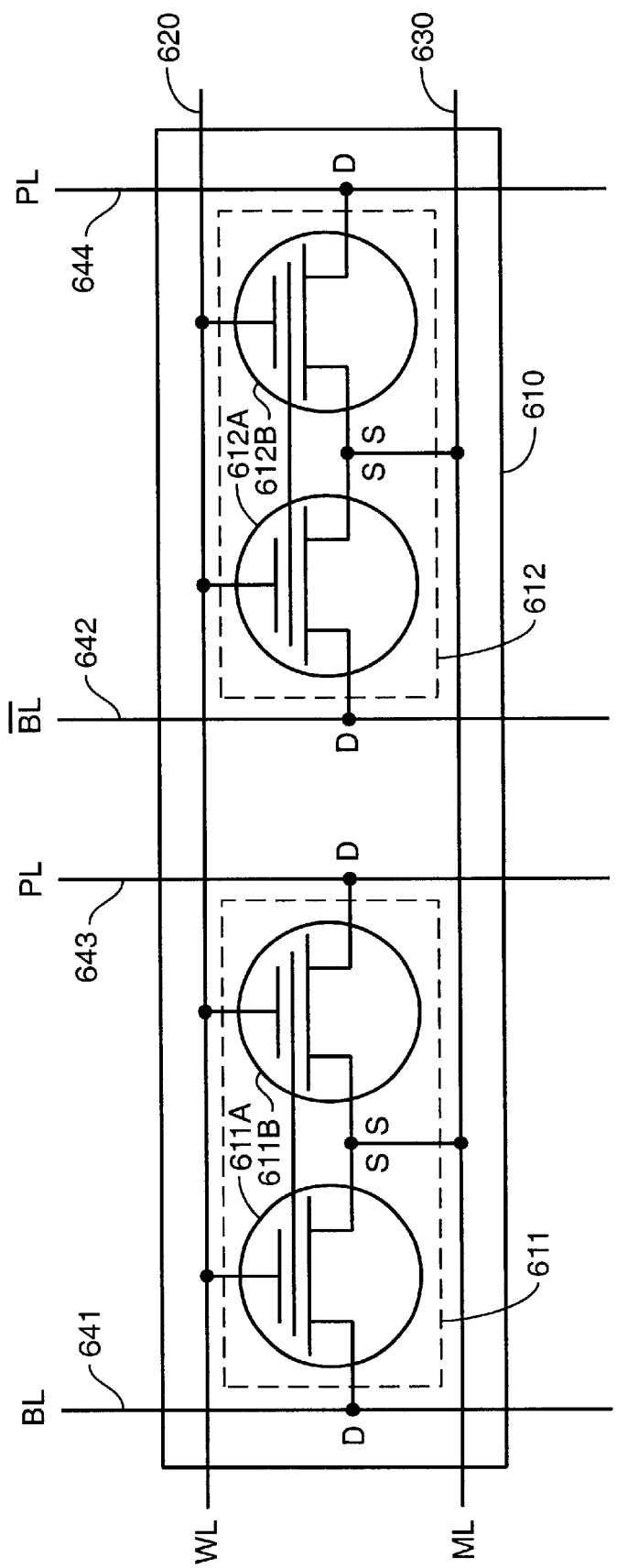
FIG._6

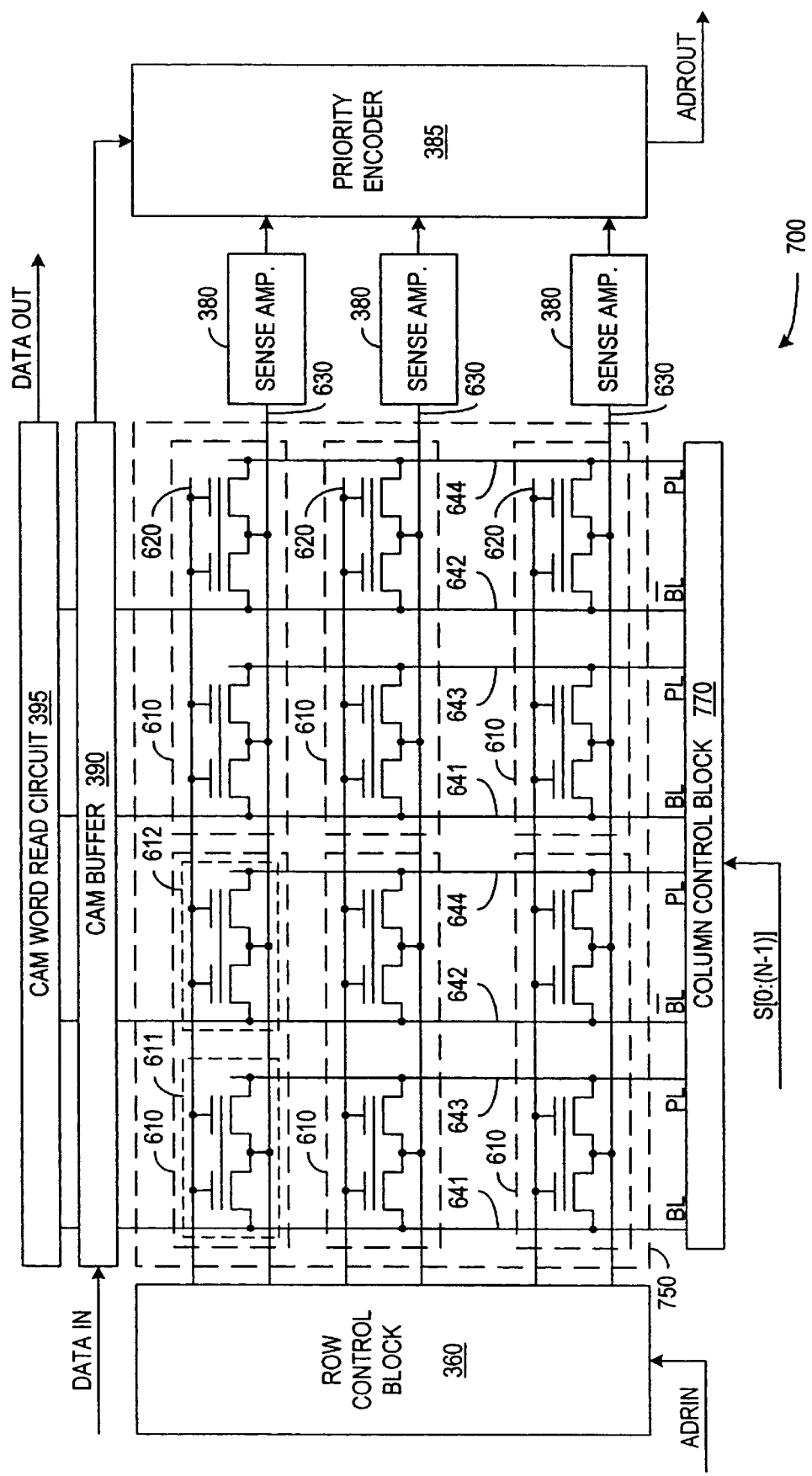
FIG._7

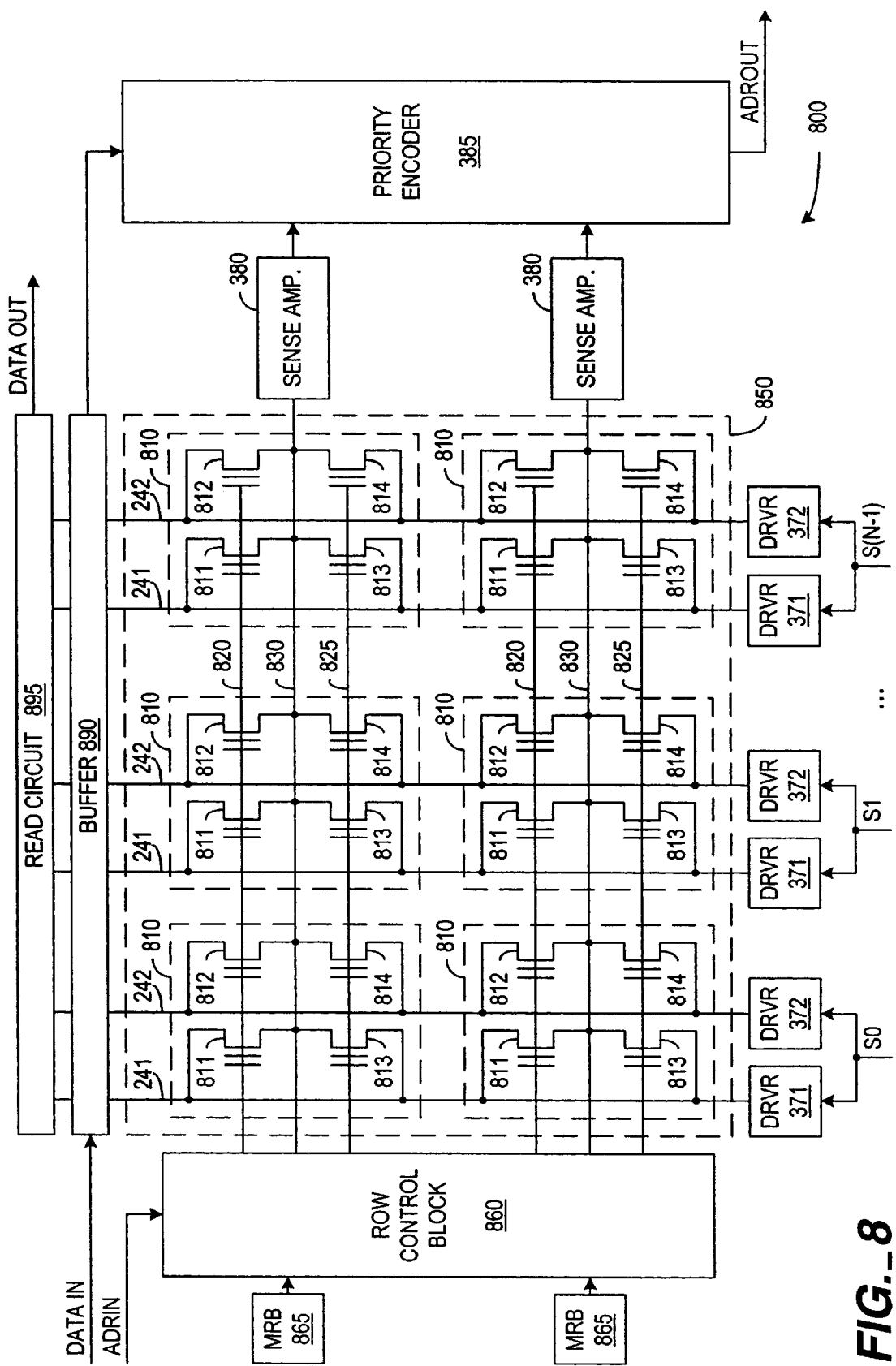
FIG._8

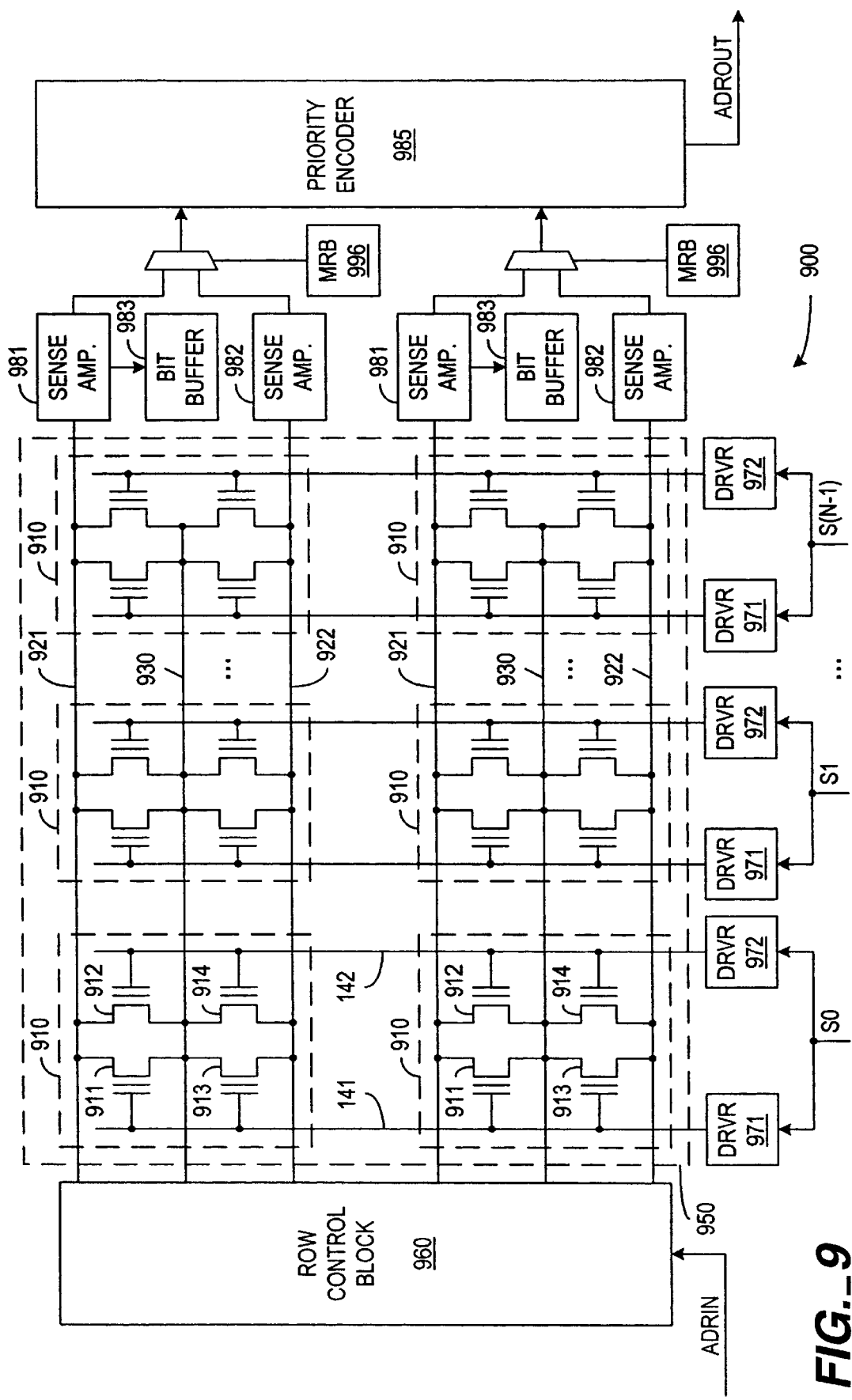
FIG._9

NON-VOLATILE CONTENT ADDRESSABLE MEMORY

BACKGROUND

1. Field of the Invention

This invention relates to non-volatile content addressable memory.

2. Description of Related Art

A content addressable memory (CAM) can store a large amount of data for simultaneous comparisons with input values. The conventional CAM includes an array of CAM cells where each row of the CAM array corresponds to a stored word. The CAM cells in a row couple to a word line and a match line associated with the row. A word line connects to a control circuit that can select the row for a write operation or bias the word line for a search. The match line carries a signal that during a search, indicates whether the word stored in the row matches an input value. Each column of the conventional CAM array corresponds to the same bit position in all of the words, and the CAM cells in a column couple to a pair of bit lines associated with the column. A search applies to each pair of bit lines, a pair of complementary binary signals that represent a bit of an input value. Each CAM cell changes the voltage on the associated match line if the CAM cell stores a bit that does not match the bit represented on the attached bit lines. Accordingly, if the voltage on a match line remains unchanged during a search, the word stored in that row of CAM cells is equal to the input value.

Known CAM cells are based on SRAM, DRAM, or non-volatile memory circuits. SRAM-based and DRAM-based CAM cells are relatively fast but must be initialized by writing a complete set of data word to the CAM when the CAM is powered up or after a power failure. Non-volatile CAM avoids the overhead and delay required for initialization of the volatile CAM since the data values remain stored in non-volatile CAM cells even when power is off. Further, non-volatile CAM requires fewer transistors and less silicon area than do SRAM-based CAM cells. FIG. 1 shows a conventional non-volatile CAM cell 100 which includes two floating-gate transistors 111 and 112 coupled to a word/match line 120, a source line 130, and a pair of bit lines 141 and 142. Word/match line 120, which couples to the drains of transistors 111 and 112, acts as both the word line and the match line for CAM cell 100. Source line 130 grounds the sources of transistors 111 and 112, and bit lines 141 and 142 couple to respective control gates of transistors 111 and 112.

CAM cell 100 can store single bit of data and compare the stored bit to an input bit that signals on bit lines 141 and 142 represent. Before writing a bit in non-volatile CAM cell 100, floating-gate transistors 111 and 112 are erased. One erase operation applies a high voltage (e.g., 12 to 15 volts) to line 120 or 130 (i.e., to the drains or sources of transistors in a row of CAM cells) and grounds bit lines 141 and 142 (the control gates). This process causes Fowler-Nordheim tunneling that removes electrons from the floating gates of transistors 111 and 112 and lowers the threshold voltages of transistors 111 and 112. The erase operation places transistors 111 and 112 in a low threshold voltage state, for example, where the threshold voltage is less than the supply voltage Vcc for the CAM. For example, a floating-gate transistor in the low threshold voltage state may have a threshold voltage Vt less than about 3 volts when supply voltage Vcc is 5 volts, less than about 1 volt when supply voltage Vcc is 3 volts, or less than about 0.5 volts when supply voltage Vcc is 1.8 volts.

Floating-gate transistors 111 and 112 are individually programmable. Programming raises the threshold voltage of a floating-gate transistor to a level higher than supply voltage Vcc. For example, a floating-gate transistor in the high threshold voltage state may have a threshold voltage Vt of greater than 6 volts in a CAM where a supply voltage Vcc is 5 volts, more than 4 volts if supply voltage Vcc is 3 volts, or more than 2.8 volts if supply voltage Vcc is 1.8 volts. In accordance with one storage convention, programming transistor 111 in the high threshold voltage state while transistor 112 remains in the low threshold voltage state stores a 1 in CAM cell 100, and programming transistor 112 to the high threshold voltage state while transistor 111 remains in the low threshold voltage state, writes a 0 in CAM cell 100. A program process for a selected floating-gate transistor 111 or 112 in the CAM array raises the bit line 141 or 142 coupled to the selected floating-gate transistor 111 or 112 to a high programming voltage Vpp (e.g., about 8 to 12 volts) and raises the word line 120 coupled to the selected CAM cell to an intermediate programming voltage Vw (e.g., 5 to 6 volts). Other unselected bit lines and word lines in the CAM array remain grounded or float. Source line 130 is grounded. The combination of these voltages on the selected floating-gate transistor 111 or 112 causes channel hot electron injection that programs the select transistor. Typically, a programming operation simultaneously programs multiple selected transistors 111 and/or 112 in multiple CAM cells 100 associated with the same CAM word or entry.

A search biases match lines 120 with a low-current, voltage source and applies complementary binary signals bit lines 141 and 142 to represent the bits of an input value. For the example storage convention described above, if a bit has value 1, an associated bit line 141 is at supply voltage Vcc, and an associated bit line 142 is grounded. If CAM cells 100 stores 1, transistor 111 has a high threshold voltage, and voltage Vcc on the control gate of transistor 111 does not turn on transistor 111. Similarly, grounding bit line 142 fails to turn on transistor 112 even when transistor 112 is in the low threshold voltage state. Since neither transistor 111 nor 112 conducts, CAM cell 100 does not pull down the voltage on the match line. If CAM cells 100 stores 0, transistor 111 has the low threshold voltage, and voltage Vcc on the control gate of transistor 111 causes transistor 111 to conduct and pull down the voltage on match line 120. A sense amplifier connected to match line 120 senses whether any CAM cells on match line 120 conduct and thereby determines whether the input value matches the stored word.

Table 1 indicates the possible combinations of stored and input bits and parameters of CAM cell 100 during a search.

TABLE 1

Possible Search Combinations

| Stored Bit/ Input Bit | Vt for 111 | Vt for 112 | BL 141 Voltage | BL 142 Voltage | ML 120 | Result |
|---|---|---|---|---|---|---|
| 0/0 | Low | High | Ground | Vcc | High | Match |
| 0/1 | Low | High | Vcc | Ground | Low | No Match |
| 1/0 | High | Low | Ground | Vcc | Low | No Match |
| 1/1 | High | Low | Vcc | Ground | High | Match |
| X/0 | High | High | Ground | Vcc | High | Match |
| X/1 | High | High | Vcc | Ground | High | Match |

A match for a CAM word occurs when all of the CAM cells in the row corresponding to the word find a match so that none of the CAM cells discharges the voltage of the match line down.

Programming both transistors 111 and 112 in CAM cell 100 to the high threshold voltage state places the CAM cell in a "don't care" state designated herein by a stored value "X". In the don't-care state, CAM cell 100 indicates a match regardless of the input bit for a search. CAMs implementing a "don't care" state, for local bit-by-bit masking, are commonly referred to as ternary CAMs.

The conventional Flash CAM architecture using two-transistor CAM cells such as CAM cell 100 suffers from several drawbacks. One drawback is that a search operation must be delayed if immediately after a write operation because the CAM needs to erase a word before a programming operation or a search can begin. Even with 0.25 µm Flash technology, erase and programming times are expected to be about 0.1 to 10 ms and 0.1 to 1 µs, respectively. Therefore, the inability to write a data word and then immediately perform a search severely affects the overall performance of non-volatile CAM. Additionally, programming multiple CAM cells in parallel, which is necessary to improve write performance, results in large word line current which require huge column pass transistors. Another disadvantage is that programming CAM cells to the "don't care" state to mask individual bits that are not relevant to a particular search destroys the original data in the CAM. Methods and structures that improve performance of non-volatile CAM, permit local bit-by-bit masking of individual bits in a non-volatile CAM without destroying data, and facilitate parallel programming of a large number of cells on the same word line or entry are desirable.

SUMMARY

In accordance with the invention, a content addressable memory (CAM) includes an array of non-volatile 2-T CAM cells where each 2-T CAM cell includes a pair of Flash memory cells that connect to word lines, bit lines, and match lines in a manner similar to the connections in conventional Flash memory arrays. In the CAM array, each word line connects to control gates of Flash memory cells in a row. Each bit line connects to drains of Flash memory cells in a column, and each match line is a source line coupled to sources of Flash memory cells in a row. Variations of the 2-T CAM cell array include an array with one word line and one match line per row of cells, an array with a split word line so that a row of CAM cells includes two rows of transistors, and an array where adjacent rows of CAM cells share a match line. The pair of Flash memory cells in a CAM cell are programmed to complementary threshold voltage states to represent data or programmed to the same threshold voltage state when the CAM cell is in a "don't care" state.

An erase of a CAM word with "negative-gate" erase technology applies negative and positive erase voltages respectively to the word and match lines associated with the word. The erase does not depend on the bit line voltages. Accordingly, the CAM array can simultaneously perform a search and an erase. An optional CAM buffer stores words to be written in the array and can also conduct a search during an erase so that the CAM can perform back-to-back write and search operations without waiting for completion of an erase operation and without missing words that are being written. The CAM buffer is typically a volatile CAM that is SRAM-based or DRAM-base that provides fast response to a write operation, but a non-volatile CAM buffer that is erased in anticipation of write operation can also provide fast write performance.

In accordance with another embodiment of the invention, a CAM cell includes two shared-floating-gate (SFG) devices. Each SFG device schematically includes a pair of floating-gate transistors that have their floating gates coupled together. In an exemplary embodiment, the two transistors in an SFG device have sources coupled to a match line and control gates coupled to a word line. The drain of one of the transistors couples to a search line, and the drain of the other transistor couples to a write bit line. The SFG CAM cells are programmed and erased in the same manner as the 2-T CAM cells, except that the write bit lines are for programming the SFG CAM cells, and search lines 641 and 642 are for searches. Accordingly, a non-volatile CAM containing an array of SFG CAM cells 610 can perform a search operation simultaneously with an erase and/or a programming operation. An array of SFG CAM cells with the architecture described herein can also use a CAM buffer to permit immediate back-to-back write and search operations without delays for either an erase operation or a delay for a programming operation.

In accordance with yet another embodiment of the invention, a dual CAM cell includes two CAM elements. Each CAM element can be a pairs of floating-gate transistors, Flash memory cells, or SFG devices. The first element acts as a CAM cell for storing a binary value 0 or 1 from a word, and the second element acts as a CAM cell programmed to represent the bit value or a "don't care" state X. A search operation in an array of dual CAM cells uses either the first elements or the second elements. Searching only the first elements compares an input value to all bits of the word without masking. The second elements are for searches that mask one or more bits. A mask register selects which CAM words are subject to masking during a search. Each element alternatively forms a 2-T CAM cell, an SFG CAM cell as disclosed herein, or any CAM cell as known in the art. One embodiment of the dual CAM cell is a four-transistor (4-T) CAM cell having a single match line. To remove masking of a particular bit, a reprogramming process erases the second element, reads a bit from the first element, and writes the bit to the second element. An array of dual CAM cells with the architecture described herein can also use a volatile CAM buffer to permit simultaneous erase and searches.

BRIEF DESCRIPTION OF THE DRAWINGS

FIG. 1 shows a known two-transistor non-volatile CAM cell.

FIG. 2 shows a two-transistor non-volatile CAM cell in accordance with an embodiment of the invention.

FIG. 3 shows a non-volatile CAM including the two-transistor CAM cells of FIG. 2.

FIG. 4 shows a non-volatile CAM in which two rows of non-volatile CAM cells share a match line in accordance with an embodiment of the invention.

FIG. 5 shows a non-volatile CAM in which non-volatile CAM cells have a split word lines in accordance with an embodiment of the invention.

FIG. 6 shows a non-volatile CAM cell including shared-floating-gate devices in accordance with an embodiment of the invention.

FIG. 7 shows a non-volatile CAM including an array of CAM cells of the type illustrated in FIG. 6.

FIGS. 8 and 9 show non-volatile CAM arrays including four-transistor dual CAM cells in accordance with alternative embodiments of the invention.

Use of the same reference symbols in different figures indicates similar or identical items.

DETAILED DESCRIPTION OF THE PREFERRED EMBODIMENTS

In accordance with an embodiment of the invention, a non-volatile content addressable memory (CAM) includes an array of novel two-transistor (2-T) non-volatile CAM cell. Each 2-T non-volatile CAM cell includes floating-gate transistors or Flash memory cells with control gates coupled to a word line, sources coupled to a match line, and drains coupled to respective bit lines. Variations of the 2-T CAM cell array include an array with one word line and one match line per row of cells, an array with a split word line so that a row of CAM cells includes two rows of transistors, and an array where adjacent rows of CAM cells share a match line. The non-volatile CAM permits simultaneous erases and searches and thus removes a performance limitation of prior non-volatile CAMs. Additionally, the non-volatile CAM may have an associated volatile CAM buffer that stores one or more words for programming into selected rows of the non-volatile array after erasing of the selected rows. A search performed during an erase compares an input value to words stored in both the non-volatile array and the volatile CAM buffer so that the erase operation does not delay the search.

FIG. 2 shows a 2-T non-volatile CAM cell 210 in accordance with an embodiment of the invention. CAM cell 210 includes two floating-gate transistors 211 and 212 coupled to a word line 220, a match line 230, and a pair of bit lines 241 and 242. Floating-gate transistors 211 and 212 are single-transistor Flash memory cells of the kind used in conventional Flash memory, but alternative embodiments of the invention can replace transistors 211 and 212 with any type of non-volatile memory cells having a control gate, a source terminal, and a drain terminal available for connection as shown in FIG. 2. In CAM cell 210, word line 220 couples to the control gates of transistors 211 and 212. Match line 230 couples to the sources of transistors 211 and 212, and bit lines 241 and 242 couple to respective drains of transistors 211 and 212. CAM cell 210 can store a single bit of data and compare the stored bit to an input bit that signals on bit lines 241 and 242 represent.

FIG. 3 shows a Flash CAM 300 which includes an array 350 of substantially identical 2-T non-volatile CAM cells 210. Flash CAM 300 also includes: a row control block 360 that couples to word lines 220 and match lines 230, sense amplifier blocks 380 that couple to match lines 230, and bit line drivers 371 and 372 that couple to bit lines 241 and 242, respectively. Row control block 360 controls the voltages on word lines 220 and match lines 230 for erase, program, read, and search operations. Row control block 360 typically includes an address decoder (not shown) that selects a row of CAM cells 210 according to an address signal ADRIN identifying a row for a write or read operation. Bias circuits (not shown) in block 360 apply voltages to selected and unselected word lines 220 and match lines 230 as required for the operations. Although FIG. 3 shows row control block 360 as a single structure for biasing word lines 220 and match lines 230, The physical circuitry for such biasing may be distributed in several locations in CAM 300. For example, match line bias circuitry for search operations may be conveniently associated with sense amplifier blocks 380. Sense amplifier blocks 380 sense currents or voltage drops on match lines 230 that identify stored words that do not match an input value. For example, during a search, a precharge circuit (not shown) in row control block 360 charges respective match lines 230 to a voltage, typically supply voltage Vcc, and each sense amplifier block 380 senses a current or a voltage drop on an attached match line 230 if any CAM cells 210 on the match line 230 conducts. Bit line drivers 371 and 372 control the voltages on bit lines 241 and 242 for erase, program, search, and read operations which are described further below. The illustrated blocks 360, 371, 372, and 380, which perform the functions described herein, can be implement using circuits and techniques well known for non-volatile memories.

A write operation in CAM 300 erases a selected row of CAM array 350 (i.e., the floating-gate transistors 211 and 212 in the row) prior to programming of the CAM cells in the selected row. Flash CAM 300 includes erasable sectors where each sector consists of a row of non-volatile CAM cells 210 that store a CAM word. An negative-gate erase operation for a selected sector of CAM cells 210 applies a negative voltage (e.g., −8–10 volts) to the word line 220 (i.e., to the control gates) of the selected row and applies a positive voltage (e.g., 5 to 7 volts) to the match line 230 (i.e., to the sources) of the selected row. The erase can employ alternative erases methods such as a grounded-gate erase or channel erase. Co-filed U.S. patent application Ser. No. UNKNOWN, entitled "Non-Volatile Memories with Improved Endurance and Extended Lifetime" describes suitable erase methods and is hereby incorporated by reference in its entirety. The voltages on bit lines 241 and 242 are typically not critical to the erase process because the combination of the control gate and source voltages causes Fowler-Nordheim (FN) tunneling in transistors 211 and 212. The FN tunneling removes electrons from floating gates and lowers threshold voltages of transistors 211 and 212. The erase operation places transistors 211 and 212 in a low threshold voltage state, for example, where the threshold voltage Vt is less than about 1 volt when supply voltage Vcc is about 3 volts. An advantage of CAM 300 when compared known non-volatile CAMs is that the erase operation in CAM 300 does not restrict the voltages on bit lines 241 and 242. Accordingly, a word in CAM 300 can be erased while bit lines 241 and 242 are biased for a search, and erasing a row of CAM array 350 does not inhibit searching of other rows of CAM array 350.

As with known non-volatile CAM, tight control of the erased threshold voltage Vt is required to keep erase threshold voltages in the proper range for the supply voltage Vcc. For exxample, the erased threshold voltage is preferably in a range from 0.5 volts to about 1 volt when supply voltage Vcc is about 3 volts. This requirement is similar to the requirements of the conventional 2-T non-volatile CAM cells. Various known erase technigues including touch-up programming can be used, after an erase, to avoid overerasure and still provide a large enough margin for search and read operations.

After the erase of a row of CAM cells 210, the write operation programs the CAM cells 210 in the row to store a CAM word. For each CAM cell 210, floating-gate transistors 211 and 212 of CAM cells 210 are individually programmable. One storage convention writes a 1 in CAM cell 210 by programming the threshold voltage of transistor 211 to a high threshold voltage state (Vt>Vcc) while transistor 212 remains in the low (or erased) threshold voltage state. Programming the threshold voltage of transistor 212 to the high threshold voltage state while transistor 211 remains in the low threshold voltage state writes a 0 in CAM cell 210. Programming both transistors 211 and 212 to the high threshold voltage state puts CAM cell 210 in the "don't care" state X.

For programming of a selected floating-gate transistor 211 or 212 in a selected CAM cell 210, row control block 360 raises the word line 220 coupled to the selected CAM cell 210 to a high voltage Vpp (e.g., about 8 to 12 volts), and grounds the match line 230 coupled to the selected CAM cell 210. A bit line driver 371 or 372 raises the bit line 241 or 242 coupled to the selected floating-gate transistor 211 or 212 to an intermediate programming voltage Vw (e.g., about 5 to 6 volts). Other bit lines 241 and 242 and word lines 220 in CAM array 350 remain grounded or float. The combination of these voltages on the selected floating-gate transistor 211 or 212 causes channel hot electron injection that programs the transistor 211 or 212 to the high threshold voltage state where the threshold voltage is higher than supply voltage Vcc.

A programming operation can simultaneously program many or all CAM cells 210 in a row. As described further below, the architecture of CAM 300 permits parallel programming of large numbers of CAM cells 210. However, a typical CAM 200 may have CAM words that are 256 bytes long, and programming can be performed in multiple steps to reduce the peak programming current. For example, programming of 256 CAM cells can be performed in four steps with 64 CAM cells being programmed in parallel during each step. Programming 64 CAM cells at a time instead of 256 CAM cells at a time reduces the peak programming current by a factor of four so that a charge pump or virtual ground device that supplies the programming current requires much less area in an integrated circuit.

When programming of a large number of CAM cells 210 in a row, programming current is distributed among different bit lines 241 and 242 and associated drivers 371 and 372, instead of being localized to a single line or single driver. Known non-volatile CAM employing CAM cells such as CAM cell 100 of FIG. 1 provide the entire programming current for CAM word through a single line 120 and a single driver for the CAM word being programmed. CAM 300 still requires a sufficiently large virtual ground device to supply the programming current for simultaneous programming of an entire row of CAM cells 210, but the virtual ground device is biased in the linear region. For CAM 300, parallel programming is practical because no one line 241 or 242 needs the capacity to carry the total programming current with the relatively high programming voltage Vw of 5 to 6 volts. Further the distribution of programming current into many bit lines 241 and 242 potentially provides superior programming performance because separate bit lines connected to drains of transistors 211 and 212 allows CAM 300 to monitor individual thresold voltages and individually terminate programming of transistors 211 and 212 during programming.

For a search, row control block 360 charges match lines 230 to supply voltage Vcc, and bit line drivers 371 and 372 apply complementary binary signals to bit lines 241 and 242. The convention for representing bits in on bit lines 241 and 242 is opposite to the convention for storing bits in CAM cells 210. For example, if as described above, transistors 211 and 212 are respectively in the high and low threshold voltage states to store a 1, a bit line driver 371 grounds the associated bit line 241 attached to transistor 211, and a bit line driver 372 raises the associated bit line 242 attached to transistor 212 to voltage Vcc to represent an input bit of value 1. If the input bit has value 0, bit line driver 371 raises bit line 241 to voltage Vcc, and bit line driver 372 grounds bit line 242. Different conventions could be used for both the data storage and the input signals. With the exception of any word lines associated with rows being erased, row control block 360 raises all word lines 220 to voltage Vcc for the search. With this biasing, none of the transistors 211 or 212 that are in the high threshold voltage state conduct, and a transistor 212 or 211 in the low threshold voltage state only conducts if the attached bit line 242 or 241 is grounded.

Table 2 indicates the possible combinations of stored and input bits and some of the parameters of CAM cell 210 during a search.

TABLE 2

Possible Search Combinations

| Stored Bit/ Input Bit | Vt for 211 | Vt for 212 | BL 241 Voltage | BL 242 Voltage | ML 230 |
|---|---|---|---|---|---|
| 0/0 | Low | High | Vcc | Ground | Match |
| 0/1 | Low | High | Ground | Vcc | No Match (211 conducts) |
| 1/0 | High | Low | Vcc | Ground | No Match (212 conducts) |
| 1/1 | High | Low | Ground | Vcc | Match |
| X/0 | High | High | Vcc | Ground | Match |
| X/1 | High | High | Ground | Vcc | Match |

A match for a CAM word occurs when all of the CAM cells 210 in the row corresponding to the CAM word find a match so that none of the CAM cells 210 discharge the voltage of the match line 230. Each sense amplifier block 380 senses current or a voltage drop on an associated match line 230 and provides a match signal to a priority encoder 385 to indicate whether an associated word stored in array 350 matches the input value.

Priority encoder 385 interprets the match signals from sense amplifier blocks 380 and generates an output signal ADROUT to indicate which word in CAM 300 matches the input value. When multiple CAM words match the input value, priority encoder 385 selects and uses signal ADROUT to identify a CAM word that is highest in a priority order. The priority order, for example, may be based on the row addresses for the CAM words, the order in which CAM words where written to CAM 300, or which CAM word priority encoder 385 last identified as a match. Priority encoders such as priority encoder 385 are well known for volatile and non-volatile CAMs.

A concern when a sense amplifier block 380 senses the attached match line 230 is the number of CAM cells 210 that conduct. For example, a "no match" can result from a single conducting CAM cell 210 in a row or N conducting CAM cells 219 in a row. Typically, N conductng CAM cells will discharge a match line faster and to a lower level than does a single conducting CAM cell. Sensing a single conducting CAM cell 210 is not difficult because known dynamic sense amplifiers can easily sense a voltage as small as 100 mV, and a single conductive CAM cell 210 can discharge a match line 230 by 100 mV in a relatively short time. However, minimizing the voltage swing when a large number of CAM cells conduct is desirable for improving the performance of sense amplifiers 380 and minimizing the AC power consumption of match lines 230 during a search. To minimize voltage swing, pull-up devices, clamps, or n-channel diodes can be attached to match lines 230 during a search to prevent any match line 230 from discharging to a very low level. (This also helps improve recovery time between searches.) Alternatively, drivers 371 and 372 can limit the time that any of the bit lines 241 and 242 are grounded and thereby limit the maximum voltage drop on any match line 230 during a search operation.

Another concern during a search is current through transistors 211 or 212 that have are in the low threshold voltage state and have drains and control gates at supply voltage Vcc. If difference between the voltage on a match line 230 and supply voltage Vcc approaches the threshold voltage of erased CAM cells those CAM cells conduct and tend to charge the match line high. If a single CAM cell 210 is discharing a match line 230, parasitic charging currents to supply voltage Vcc from the other N-1 CAM cells makes sensing more difficult. To avoid significant problems, the erased threshold voltages are tightly controlled to be above about 0.5 volts (e.g., in a range from 0.5 V to 1.0 V for a supply voltage Vcc of about 3 volts). Accodingly, if the discharging CAM cell or cells 210 drop the voltage on a match line 230 by only 100 mV (an amount sufficient for current dynamic sense amplifers to sense), the other CAM cells 210 on the match line will not provide a significant charging current from supply voltage Vcc.

An advatage of CAM cell 210 and CAM 300 over conventional non-volatile CAM is lower AC power consumption when toggling bit lines 241 and 242 at high frequencies. In particular, for performing a search operation, bit line drivers 371 and 372 can raise both bit lines to "high" (or supply voltage Vcc) while row control block charges match lines 230. Drivers 371 and 372 then pulse one of each each pair of bit lines to "low" (or ground) for the search. For a seires of searches back-to-back, bit lines 241 and 242 toggle from low to high and back, with a frequency that depends on the search value. For CAM cell 210 and CAM 300, bit lines 241 and 242 connect to drains of floating-gate transistors and have capacitance dominated by the junction and the gate-to-drain capacitance $C_{GATE/DRAIN}$ of the transistors 211 or 212. Conventional CAMs have bit lines coupled to the gates of floating-gate transistors, and the full gate capacitance $C_{GATE}$ dominates the bit line capacitance. The lower bit line capacitiace for memory 300 leads to lower power consumption, higher performance and faster match line response.

One method for repeated searches in CAM 300 provides a DC word line bias (high) and switches the bit line voltages using a sufficiently large virtual ground device to provide the current for drivers 371 and 372. Alternatively, block 360 switches word lines 220 from low to high when bit line voltages switch. In either case, since the CAM word is usually limited to no more than a few hundred bits, the RC delay for charging word lines 220 is not in the critical speed path that limits search speed.

For a serial read operation, row control block 360 biases the match line 230 associated with a CAM row being read to a read voltage Vr (typically about 1.5 V) and biases the word line 220 for the row to supply voltage Vcc. Drivers 371 and 372 ground the bit line 241 or 242 coupled to a selected transistor 211 or 212 bein read and bias all unselected bit to supply voltage Vcc. The sense amplifier 380 coupled to the selected match line can then sense whether the selected transistor 211 or 212 conducts, to read the bit value stored in the selected CAM cell 210. Reading an entire CAM word in this manner requres serially selecting and reading each CAM cell in a row. However, a particular bit from each CAM word can be read simultaneously.

In accordance with another aspect of the invention, optional read circuitry 395 connects to bit lines 241 or 242 for a parallel read operation. Read circuitry 395 includes, for example, bit line bias circuits and sense amplifiers that couple to bit lines 241 (or bit lines 242). A bit-line bias circuit biases or charges an attached bit line 241 for reading (e.g., to about 1.5 volts) while block 360 biases a selected word line 220 to voltage Vcc and grounds match lines 230 and unselected word lines 220. The bit-line sense amplifiers in read circuitry 395 sense currents or voltage drops on the attached bit lines 241 for a fast parallel read-out of a word from CAM 300. The parallel read operation is typically faster and more convenient for testing of CAM 300 and other uses.

As a further aspect of the invention, Flash CAM 300 includes a CAM buffer 390 capable of a fast write operation. In an exemplary embodiment, CAM buffer 390 is a SRAM-based CAM including storage for at least one word. Alternatively, a DRAM-based CAM buffer could be used, but DRAM requires overhead for refresh operations. Such refresh circuitry is typically not warranted for the small amount of storage in CAM buffer 390. In another embodiment, CAM buffer 390 includes non-volatile CAM cells that are pre-erased in anticipation of the initiation of a write operation. In an application of CAM 300 where writing is relatively infrequent, erase operations for non-volatile cells in buffer 390 can be performed in the background of operation of CAM 300. With pre-erased rows, writing to CAM buffer 390 only required programming of CAM cells, and erasing does not delay the writing.

A write operation to CAM 300 temporarily stores an input word in CAM buffer 390 while a row of non-volatile array 350 is erased and subsequently programmed. Writing to CAM buffer 390 is fast when compared to the writing operations for non-volatile CAM array 350 which requires an erase operation prior to programming. With CAM buffer 390 holding a value to be written in array 350, CAM 300 can perform a search while the write operation erases a word in non-volatile array 350. In particular, as mentioned above, biasing bit lines 241 and 242 for a search does not disturb an erase operation. Similarly, row control block 360 biases the word line 220 and match line 230 of a selected row or rows for the erase operation while biasing word lines 220 and match lines 230 for every other row of array 350 for the search. Simultaneously with the search in non-volatile array 350, CAM buffer 390 searches temporarily stored values for a match, and a signal from CAM buffer 390 indicates whether the input value matches a word being written.

A priority encoder 385 accepts match signals from both array 350 (via sense amplifier blocks 380) and CAM buffer 390. If any row that is not being erased contains a word matching the input value, the associated block 380 signals to priority encoder 360, and priority encoder 360 handles the match signals from blocks 380 in the same manner as described for searches without simultaneous erase operations. Each block 380 that corresponds to a row being erased is disabled or ignored. If CAM buffer 390 signals that the word being written matches the input value, priority encoder 360 sets output signal ADROUT according to an address identifying the row to which the word is being written. For multiple matches, priority encoder 385 can sequentially output signal ADROUT according to a predetermined order for the CAM words such as according to the binary address order.

In FIG. 3, CAM buffer 390 couples to bit lines 241 and 242. This connection can be used during a search if the storage convention for the CAM cells of CAM buffer 390 are consistent with the signals on bit lines 241 and 242 during a write operation. However, CAM buffer 390 can be separate from array 350 and include its own write and match circuits. As indicated above, memory 300 is capable of back-to-back write and search operations since array 350 and buffer 390 can perform a search while a row of array 350 is being erase. Similarly, CAM 300 can simultaneously or sequentially erase multiple rows for back-to-back write operations with CAM buffer 390 storing the words to be written to array 350 when the corresponding rows in CAM array are ready for programming.

FIG. 4 shows a non-volatile CAM 400 in accordance with another embodiment of the invention. CAM 400 includes an array 450 of CAM cells 410, each CAM cell 410 including a pair of floating-gate transistors 211 and 212. Transistors 211 and 212 connect to a word line 420 or 425, a match line 430, and bit lines 241 and 242 in the same manner that transistors 211 and 212 connect word line 220, match line 230, and bit lines 241 and 242 in FIGS. 2 and 3. CAM array 450 differs from CAM array 350 of FIG. 3 in that two adjacent rows of CAM cells 410 share a single match line 430. The sharing of match lines 430 between two adjacent CAM words can significantly reduce the silicon area required for forming CAM 400 as an integrated circuit, but only half of the rows of CAM cells 410 in array 450 can perform a search at one time.

A search operation in CAM 400 takes two cycles. During both cycles, bit line drivers 371 and 372 bias bit lines 241 and 242 as described above for a search in CAM 300 of FIG. 3, and a row control block 460 biases or charges match lines 430 in the same manner that row control block 360 biases or charges match lines 230. During a first cycle of a search, row control block 460 biases even numbered word lines 420 to supply voltage Vcc and grounds odd numbered word lines 425. Thus, during the first cycle, the states of match lines 430 indicate whether any of the even-numbered row of array 450 contains a match to the input value. The search can stop after the first cycle if a match is found. Alternatively, match results from the first cycle of the search can be stored in latches 481. During a second cycle of the search, row control block 460 biases odd-numbered word lines 425 to supply voltage Vcc and grounds even-numbered word lines 420, and the states of match lines 430 indicate whether any odd-numbered row of array 450 contains a match to the input value S[0:(N-1)]. The results from both cycles of the search can be applied to priority decoder 485 either directly or through latches 481.

Priority encoder 485 generates output signal ADROUT according to the signals from sensing blocks 380 and the cycle during which the match was detected. Specifically, priority encoder 485 can identify all but the least significant bit of signal ADROUT by identifying the sensing block 380 indicating a match. Priority encoder 485 identifies the least significant bit of signal ADROUT from whether the match was found during the first or second cycle of the search. Priority encoder 485 may be the same as priority encoder 385 of FIG. 3 or may include additionally logic for the two-cycle search.

CAM 400 also includes optional CAM buffer 390. CAM 400 can perform a search during an erase operation. However, an erase operation for a row of array 450 interferes with searching the row that couples to the same match line 430 as the row being erased. In accordance with an aspect of the invention, a write operation for a row can includes a preliminary parallel reading of an adjacent row and writing the value read to CAM buffer 390 before beginning to erase the selected row. A search uses CAM buffer 390 to determine whether a value being written or the value from the row adjacent to the row being erased matches the input value S[0:(N-1)]. Row control block 460 grounds the word line of the adjacent row while applying a negative voltage to the word line for the row being erased. When a search is performed during an erase, priority encoder 485 generate signal ADROUT according to signal ADRIN if CAM buffer 390 finds a match.

CAM 400 can perform write and read operations in substantially the same manner as described above for CAM 300 of FIG. 3.

FIG. 5 illustrates a non-volatile CAM 500 that includes an array 550 of CAM cells 510 having spit word lines. Each CAM cell 510 includes a pair of floating-gate transistors 511 and 512 which have sources coupled to the same match line 230. The drains of transistors 511 and 512 respectively couple to bit lines 541 and 542, and the control gates of transistors 511 and 512 respectively couple to word lines 521 and 522. In operation, a row control block 560 biases the word lines 511 and 512 in a row of CAM cells 510 to the same voltage so that the word lines 511 and 512 effectively operate as a single word line that is split and coupled to control gates of floating gate transistors in adjacent rows. Since transistors 511 and 512 in adjacent rows, which share a match line 230, are associated with the same CAM word, a single cycle search is sufficient for CAM 500. The primary difference between CAM 500 and CAM 300 is in the layout of arrays 550 and 350. In particular, array 550 includes two bit lines 541 and 542 for each column of transistors 511 and 512. Array 350 includes one bit line 241 or 242 for each column of transistors 211 or 212. Further, array 550 has twice as many rows of transistors and half as many columns of transistors as does array 350 if arrays 350 and 550 contain the same number of rows and columns of CAM cells. CAM 500 otherwise operates in a similar manner to that of CAMs 300 and 400 of FIGS. 3 and 4.

A drawback of CAMs 300, 400, and 500 is that a programming operation is incompatible with a simultaneous search. In particular to program a row of CAM cells in any of CAMs 300, 400, and 500, drivers 371 and 372 bias the bit lines connected to the drains of the transistors being programmed to a programming voltage (e.g., between 5 and 6 volts) and ground the bit lines of the transistors remaining in the low threshold voltage state. This biasing of the bit lines is incompatible with the bit line biasing for a search operation. Accordingly, a search can be initiated during the first part of a write operation while erasing a row of CAM cells, but no search is possible during the second part or a write while a word is being programmed into the erased row. Programming time for a non-volatile memory cell is typically longer than the write time for an SRAM or DRAM based CAM. For example, programming a floating-gate transistor with channel hot electron injection typically requires about 100 ns to about 1 $\mu$s, while a write in and SRAM takes about 10 ns or less. Accordingly, CAMs 300, 400, and 500 may delay a search operation for completion of programming when initiation of a search is attempted during programming.

FIG. 6 illustrates a non-volatile CAM cell 610 suitable for a CAM that permits a search during erase and programming operations. CAM cell 610 includes a pair of shared-floating-gate (SFG) devices 611 and 612. Each SFG device 611 or 612 schematically includes a pair of floating-gate transistor 611A and 611B or 612A and 612B which have floating gates coupled together. The sources of transistors 611A, 611B, 612A, and 612B connect to a match line 630, and the control gates of transistors 611A, 611B, 612A, and 612B connect to a word line 620. The drains of transistors 611A and 612A couple to search lines 641 and 642, and the drains of transistors 611B couple to programming lines 643 and 644. Searches use search lines 641 and 642, and programming operations use programming lines 643 and 644. As described further below, SFG devices 611 and 612 can be made symmetric to permit interchange the roles of search lines 641 and 642 and programming lines 643 and 644. This effectively double the endurance of CAM cell 610 by dividing the number of programming operations conducted through transistors 611B and 612B in half. However, swapping the roles of transistors 611A and 612A with the roles of transistors 612B and 612B require additional logic as chip space in an integrated circuit CAM.

An SFG device can be made using conventional integrated circuit manufacturing techniques. One such process defines the gate and field oxide areas and implants drain regions and a shared source region in a semiconductor substrate. A first patterned polysilicon layer is then formed overlying the silicon substrate. A second patterned layer (or word line) acts as an etch-protect mask when forming a floating gate extending from one drain region across the shared source region to the opposite drain region. The source region extends laterally perpendicular to the floating gate to permit forming contacts between the source region and match line 630. Implantation using the floating gate as a part of a mask can further define the source and drain regions. A portion of a word line formed over the shared floating gate constitutes the control gates to the SFG device.

FIG. 7 shows a CAM 700 including an array 750 of CAM cells 610. CAM 700 also includes row control block 360 which controls biasing of word lines 620 and match lines 630, a column control block 770 which controls biasing of search lines 641 and 642 and programming lines 643 and 644, sense amplifier blocks 380 coupled to match lines 630, CAM buffer 390, read circuits 395, and priority encoder 385 which couples to blocks 380 and CAM buffer 390.

For a negative-gate erase a selected row of array 750, row control block 360 applies a negative voltage (e.g., −8–10 volts) to the word line 620 of the selected row and applies a positive voltage (e.g., 5 to 7 volts) to the match line 630 of the selected row. This combination of voltage causes FN tunneling that removes electrons from the shared floating gates in the SFG devices and lowers the threshold voltages of both transistors in each SFG device 611 and 612 of each CAM cell 610 in the row. (CAM 700 could also use a grounded-gate erase method.) The voltages on search lines 641 and 642 and programming lines 643 and 644 are not critical to the erase operation. Accordingly, search lines 641 and 642 can be biased for a search of other rows while the selected row is being erased. Additionally, programming lines 643 and 644 can be biased for programming of another row or rows while the selected row is being erased.

To program a selected row of CAM cells 610, row control block 360 applies programming voltage Vpp (e.g., about 8 to 12 volts) to the word line 620 of the selected row and grounds the match line 630 of the selected row. For each column of CAM cells 610, column control block 770 applies programming voltage Vw (e.g., 5 to 6 volts) to the programming lines 643 or 644 corresponding to the SFG devices 611 and 612 that are being programmed up to the high threshold voltage state. The programming lines 643 and 644 associated with SFG devices 611 and 612 that are to remain in the erased state can be kept at a low voltage except during a search when column control block 770 applies supply voltage Vcc to the programming lines 643 and 644 associated with SFG devices 611 and 612 that are to remain in the erased state after programming. The combination of programming voltages Vpp and Vw respectively on the control gate and drain of a SFG device 611 or 612 causes channel hot electron injection into the shared floating gate of the SFG device 611 or 612 and raises the threshold voltages of both SFG devices 611 and 612. The supply voltage Vcc, when 3 volts or less, does not cause significant channel hot electron injection. The voltages on search lines 641 and 642 do not affect the programming operation. In particular, a search line 641 or 642 being grounded does not disturb channel hot electron injection via current from a programming line 643 or 644 at the programming voltage and does not create an injection current because both the source and drain are grounded. A search line 641 or 642 being at supply voltage Vcc of 2.5 or 3 volts or lower is insufficient to create a significant number of channel hot electrons that might change the threshold voltage during the short programming time.

For a search operation, row control block 360 applies the supply voltage Vcc (or a reduced voltage) to each word line 620 except any word lines that correspond to rows being erased or programmed. Column control block 770 biases each pair of search lines 641 and 642 with complementary signals (Vcc or 0 V) representing a corresponding input bit S0 to S(N-1). A device 611 or 612 in a CAM cell conducts current which a sense amplifier block 380 senses on a match line 630 if the device 611 or 612 is in the low threshold voltage state and the attached search line 641 or 642 is grounded. The voltages on programming lines 643 and 644 do not affect the search because the sources of transistors 611B and 612B are at or near supply voltage Vcc, and the drains of transistors 611B and 612B either are at supply voltage Vcc or the programming voltage Vw which is greater than the supply voltage Vcc. The supply voltage Vcc on the word line 620 differs from the source and drain voltages of transistors 611B and 612B by less than the threshold voltage even in the low threshold voltage state. Accordingly, transistors 611B and 612B do not conduct a current that would interfere with sense amplifier blocks 380 sensing of match lines 630.

As described herein, supply voltage Vcc is used as a convenient voltage for biasing lines for search and programming operations. However, other voltages can be used. For example, to further reduce unintended programming, the voltage on the search lines 641 and 642, word line 620, and match line 630 can be at a reduced voltage, i.e., lower than supply voltage Vcc, for a search with programming lines 643 and 644 that are not selected for programming being kept at the reduced voltage. This reduced voltage, while being lower than supply voltage Vcc, must be greater than the highest threshold voltage of a CAM cell in the erased state.

CAM 700 can search during an erase or programming operation. CAM buffer 390 temporarily stores words being written and searches the temporarily stored word for a match while array 750 searches. Priority encoder 385 generates signal ADROUT to identify the match in the same manner as described above in regard to FIG. 3.

In accordance with another aspect of the invention, FIG. 8 illustrates a non-volatile CAM 800 including an array 850 of dual CAM cells 810. Array 850 is structurally the same as array 450 of FIG. 4, but each CAM cell 810 contains two CAM cells 410 of array 450. Thus, each CAM cell 810 is a 4-T CAM cell that couples to associated bit lines 241 and 242, associated word lines 820 and 825, and a match line 830. In each CAM cell 810, a first pair of floating-gate transistors 811 and 812 have control gates coupled to word line 820 and sources coupled to match line 830. Respective drains of floating-gate transistors 811 and 812 connect to respective bit lines 241 and 242. A second pair of floating-gate transistors 813 and 814 have control gates coupled to word line 825 and sources coupled to match line 830. Respective drains of floating-gate transistors 813 and 814 connect to respective bit lines 241 and 242.

A row of CAM cells 810 is selectively erased and then programmed to write a word to non-volatile CAM array 850. For an erase, a row control block 860 selects both word lines 820 and 825 associated with the word and biases the selected word lines 820 and 825 to a negative voltage (e.g., −8–10 volts). Block 860 also selects a match line 830 and biases the selected match line 830 to a positive voltage (e.g., 5 to 7 volts). The voltages on bit lines 241 and 242 are not critical to the erase operation. The combination of erase voltages causes FN tunneling that lowers the threshold voltages of the floating-gate transistors 811, 812, 813, and 814 to the low threshold voltage state (e.g., less than about 1 volt for a supply voltage Vcc of 3 volts).

Floating-gate transistors 811, 812, 813, and 814 within a 4-T CAM cell are individually programmable. To program a selected transistor 811, 812, 813, or 814 in a selected CAM cell 810, row control block 860 grounds the match line 830 coupled to the selected CAM cell 810 and applies a programming voltage (e.g., 8 to 12 volts) to the word line 820 or 825 coupled to the selected transistor. A driver 371 or 372 applies programming voltage Vw (e.g., 5 to 6 volts) to the bit line 241 or 242 coupled to the selected transistor. The combination of the programming voltages causes channel hot electron injection that raises the threshold voltage of the selected transistor to the high threshold voltage state. When writing a word to a row of CAM array 850, each CAM cell 810 in the row can be simultaneously programmed. In one programming operation, transistors 811 and 813 are initially programmed to one threshold voltage state, and transistors 812 and 814 are initially programmed to the other threshold voltage state. Subsequently, a transistor 813 or 814 in specific CAM cell 810 are programmed to the high threshold voltage state for masking of specific bits in the CAM word.

One convention for storing a bit in a memory cell 810, programs transistors 811 and 812 respectively to the high threshold voltage state and the low threshold voltage state to store a 1, and programs transistors 811 and 812 respectively to the low threshold voltage state and the high threshold voltage state to store a 0. (The opposite programming convention could also be used.) Transistors 813 and 814 are programmed in the same manner as respective transistors 811 and 812 to store a 1 or 0, but for masking, both transistors 813 and 814 are programmed to the high threshold voltage state for the "don't care" state X.

For a search, drivers 371 and 372 bias respective bit lines 241 and 242 with complementary signals as described above for memory 300. However, during search in CAM 800, row control block 860 applies supply voltage Vcc to only one of two CAM word lines 820 and 825, the word line 820 or 825 being selected according to whether the search uses masking. For a search without masking, row control block 860 biases word lines 820 and match lines 830 to voltage Vcc and grounds word lines 825. In each CAM cell 810, transistors 813 and 814 do not conduct because word lines 825 are grounded. A transistor 811 or 812 conducts only if it is in the low threshold voltage state and the attached bit line 241 or 242 is grounded. For a search with masking, row control block 860 biases word lines 825 and match lines 830 to voltage Vcc and grounds word lines 820. Drivers 371 and 372 again bias respective bit lines 241 and 242 with complementary signals as described above for memory 300. In each CAM cell 810, transistors 811 and 812 do not conduct because word lines 820 are grounded. A transistor 813 or 814 conducts only if it is in the low threshold voltage state and the attached bit line 241 or 242 is grounded.

Masking can selectively activated for only some of the CAM words. In particular, a mask select register connected to row control block 860 has one mask register bit (MRB) 865 per CAM word. During a search operation, each mask register bit 865 controls whether row control block 860 applies supply voltage Vcc to word line 820 or 825 in the row of array 850 that corresponds to the bit.

Table 3 lists possible search results and some of the parameters in the searches.

TABLE 3

Possible Search Combinations for 4-T Cells

| Stored Bit/ Input Bit | Vt for 811 | Vt for 812 | Vt for 813 | Vt for 814 | BLs 241,242 | WLs 820,825 | ML 830 |
|---|---|---|---|---|---|---|---|
| Without Masking | | | | | | | |
| 0/0 | Low | High | Low | High | Vcc, 0 | Vcc, 0 | Match |
| 0/1 | Low | High | Low | High | 0, Vcc | Vcc, 0 | No Match |
| 1/0 | High | Low | High | Low | Vcc, 0 | Vcc, 0 | No Match |
| 1/1 | High | Low | High | Low | 0, Vcc | Vcc, 0 | Match |
| With Masking | | | | | | | |
| 0/0 | Low | High | High | High | Vcc, 0 | 0, Vcc | Match |
| 0/1 | Low | High | High | High | 0, Vcc | 0, Vcc | Match |
| 1/0 | High | Low | High | High | Vcc, 0 | 0, Vcc | Match |
| 1/1 | High | Low | High | High | 0, Vcc | 0, Vcc | Match |

Each bit in a CAM word is individually maskable by appropriate programming of the transistors 813 and 814 in the CAM cells 810 associate with the bit. Masking of a bit does not destroy the original value in CAM array 850 because transistors 811 and 812 remain in threshold voltage states that indicate the original bit. Masking one bit does not affect other bits on the same word line, which may or may not need masking.

Masking can be implement in a single CAM word, multiple CAM words, or all CAM words in array 850, and the masking implemented for one CAM word can be different from the masking for another CAM work. In accordance with an aspect of the invention, CAM 800 can reprogram CAM cells 810 to change the masking. One re-programming process for the entire array 850 includes erasing transistors 813 and 814 in all CAM cells 810, reading data words using transistors 811 or 812, and sequentially programming rows of transistors 813 and 814 according to the data words read and the desired masking. To erase just the transistors 813 and 814 from a row of CAM cells 810, row control block 860 applies the negative erase voltage to a selected word line 825 and grounds word lines 820. Block 860 also biases the match line 830 of the selected row of CAM array 850 to a positive programming voltage. The combination of the negative control gate voltage and the positive source voltage on transistors 813 and 814 in the selected row causes FN tunneling that erases transistors 813 and 814. FN tunneling is insignificant for transistors 811 and 812 in the selected row because transistors 811 and 812 do not have control gates (i.e., word line 820) at the negative programming voltage.

A read circuit 895 reads a word from the selected row of array 850 and writes the word in a buffer 890. For the read process, block 860 applies voltage Vcc to the word line 820 for the row being read and grounds match lines 830 and unselected word lines 820 and 825. Read circuit 895 biases bit lines 241 or 242 and senses whether transistors 811 or 812 in the selected row conduct. Buffer 890 can be conventional buffer or a CAM buffer that stores the read word for subsequent programming of transistors 813 and 814 in the selected row. The programming of transistors 813 and 814 depends on the word read and the masking. Programming both transistors 813 and 814 to the high threshold voltage state indicates a "don't care" bit. Otherwise, programming sets transistor 813 in the high threshold voltage state if the corresponding read bit is 1 and sets transistor 814 in the high threshold voltage state if the corresponding read bit is 0.

CAM 800 includes dual CAM cells 810 based on two CAM cells having the architecture of CAM cells 410 of FIG.

4. Dual CAM cells can alternatively be based on pairs of CAM cells having other architectures such as CAM cells 510 of FIG. 5, CAM cells 620 of FIG. 6, or known CAM cells.

FIG. 9 shows a non-volatile CAM 900 including an array 950 of non-volatile dual CAM cells 910. Each dual CAM cell 910 is a 4-T CAM cell including floating-gate transistors 911, 912, 913, and 914. Each transistor 911 to 914 has a drain coupled to a shared drain line 930. Transistors 911 and 912 have sources coupled to a word/match line 921, and transistors 913 and 914 have sources coupled to a word/match line 922. Control gates of transistors 911 and 913 couple to bit line 141, and control gates of transistors 912 and 914 couple to bit line 142. With these connections, transistors 911 and 912 form a first CAM element having the same structure as that of the conventional 2-T Flash CAM cell 100 of in FIG. 1, except that the roles of the source and drains of the transistors are reversed. Similarly, transistors 913 and 914 form a second CAM element having the same structure as the first CAM element.

The data storage convention for CAM 900 programs transistor 911 or 912 to the high threshold voltage state to represent a 1 or 0. Transistors 913 and 914 are programmed the same as transistors 911 and 912 respectively if the bit associated with the CAM cell 910 is not masked. Both transistors 913 and 914 have the high threshold voltage state if the bit associated with the CAM cell 910 is masked. Since the states of transistors 911 and 912 indicate the original data value, memory 900 can reprogram transistors 913 and 914 to change which bits are masked. The reprogramming process is described further below.

To erase a CAM word, bit line drivers 971 and 972 bias bit lines 141 and 142 (i.e., the control gates) to a negative voltage (e.g., −8–10 volts). A row control block 960 selects word/match lines 921 and 922 associated with the word to be erased and applies a positive erase voltage (e.g., 5 to 7 volts) to the selected word/match lines 921 and 922. Unselected word/match lines 921 and 922 are grounded. Drain lines 930 float or are grounded, but the biasing of drain lines 930 is not critical to the erase process. The exchange of the roles of the drain and the source in dual CAM cells 910 when compared to the conventional cell 100 permits erasing of single row of transistors by applying an erase voltage to a match line 921 922.

CAM 900 can also erase a selected transistor 911, 912, 913, or 914 or multiple transistors in a column by having a single bit line driver 971 or 972 apply the negative programming voltage to just the bit line or lines coupled to the selected transistor or transistors. Control block 960 applies the positive erase voltage only to the word lines 921 or 922 coupled to transistors to be erased.

To program a CAM word, drivers 971 and 972 apply a high programming voltage Vpp to the bit lines 141 and 142 that couple to transistors to be raised to the high threshold voltage state. Row control block 960 applies programming voltage Vw to the drain line 930 associated with the CAM word and grounds the word/match line 921 or 922 coupled to the transistors being programmed. The unselected word/match line 922 or 921 for the row of transistors that share the drain line 930 at voltage Vw floats.

For a search, row control block 960 biases or charges word/match lines 921 and/or 922 to a read voltage and grounds drain lines 930. Drivers 971 and 972 bias bit lines 141 and 142 according to an input value, and sense amplifiers 981 and 982 sense which word/match lines 921 and 922 couple to conductive transistors. Sense amplifiers 981 couple to match lines 921 which couple to transistors 911 and 912. Sense amplifiers 982 couple to match lines 922 which couple to transistors 913 and 914 and may be programmed for masking. For a search without masking, a priority encoder 985 uses only signals from sense amplifiers 981 to generate the output signal ADROUT identifying a matching CAM word. For a search with masking, priority encoder 985 uses signals from sense amplifiers 982 to generate output signal ADROUT. Selection of sense amplifier 981 or 982 and match line 921 or 922 for a search can be on a row-by-row (or CAM word-by-CAM word) basis. In particular, a mask register includes one mask register bit (MRB) 996 per CAM word and applies each bit 996 to a corresponding 2:1 multiplexer 984 as a select signal. Accordingly, the match signals to priority encoder 985 indicate matches with programmable combination of matches with masked and unmasked CAM words.

Sense amplifiers 981 can alternatively read a selected bit from each CAM word. For such a read operation, the driver 971 associated with the selected bit applies supply voltage Vcc to the attached bit line 141, and control block 960 applies a read voltage to match lines 921 and grounds drain lines 930. Sense amplifiers 981 then sense which transistors 911 that are connected to the selected bit line 141 conduct. The read value that results from the sensing can be stored in bit buffers 983 and used during reprogramming that removes masking from the selected bit. CAM 900 can use a single bit buffer located in the periphery of CAM array 950 instead of the separate bit buffers 983 illustrated in FIG. 9.

CAM 900 permits reprogramming to change the masking of CAM words. To remove masking from a selected bit, CAM 900 reads the bits that a column of transistors 911 represent and stores those bits in bit buffers 983. Transistors 913 and 914 in the column corresponding to the selected bit are erased and selectively programmed according to the values in bit buffers 983. To mask a bit that is currently unmasked, transistors 913 and 914 in the column associated with the bit are programmed to the high threshold voltage state.

Although the invention has been described with reference to particular embodiments, the description is only an example of the invention's application and should not be taken as a limitation. Various other adaptations and combinations of features of the embodiments disclosed are within the scope of the invention as defined by the following claims.

What is claimed is:

1. A content addressable memory (CAM) cell comprising:
   a first non-volatile device having a control gate coupled to a word line, a drain coupled to a first bit line, and a source coupled to a match line; and
   a second non-volatile device having a control gate coupled to the word line, a drain coupled to a second bit line, and a source coupled to the match line, wherein:
   the first non-volatile device comprises a first shared-floating-gate device; and
   the second non-volatile device comprises a second shared-floating-gate device.

2. A content addressable memory (CAM) cell comprising:
   a first non-volatile device having a control gate coupled to a word line, a drain coupled to a first bit line, and a source coupled to a match line, wherein the first non-volatile device comprises a first shared-floating-gate device; and
   a second non-volatile device having a control gate coupled to the word line, a drain coupled to a second bit line, and a source coupled to the match line, wherein the second non-volatile device comprises a second shared-floating-gate device, wherein for a search to determine whether the CAM cell stores a "1";
the first bit line is at a first voltage that is below a first threshold voltage, the first threshold voltage being a threshold voltage of a non-volatile memory cell in the low threshold voltage state;
the second bit line is at a second voltage that is between the first threshold voltage and a second threshold voltage, the second threshold voltage being a threshold voltage of a non-volatile memory cell in the high threshold voltage state;
the word line is at the second threshold voltage; and
a current from the match line through the CAM cell indicates that the CAM cell does not store a "1".

3. A content addressable memory (CAM) cell comprising:
a first non-volatile device having a control gate coupled to a word line, a drain coupled to a first bit line, and a source coupled to a match line;
a second non-volatile device having a control gate coupled to the word line, a drain coupled to a second bit line, and a source coupled to the match line;
a third non-volatile device having a control gate coupled to a second word line, a drain coupled to the first bit line, and a source coupled to the match line; and
a fourth non-volatile device having a control gate coupled to the second word line, a drain coupled to the second bit line, and a source coupled to the match line.

4. A content addressable memory (CAM) cell comprising:
a first non-volatile device having a control gate coupled to a word line, a drain coupled to a first bit line, and a source coupled to a match line, wherein the first non-volatile device comprises a first shared-floating-gate device; and
a second non-volatile device having a control gate coupled to the word line, a drain coupled to a second bit line, and a source coupled to the match line, wherein the second non-volatile device comprises a second shared-floating-gate device, wherein:
when storing a "1" without masking, the first and third non-volatile devices are in a high threshold voltage state and the second and fourth non-volatile devices are in a low threshold voltage state;
when storing a "0" without masking, the first and third non-volatile devices are in the low threshold voltage state and the second and fourth non-volatile devices are in the high threshold voltage state;
when storing a "1" with masking, the first, third, and fourth non-volatile devices are in the high threshold voltage state and the second non-volatile device is in the low threshold voltage state; and
when storing a "0" with masking, the first non-volatile device is in the low threshold voltage state and the second, third, and fourth non-volatile devices are in the high threshold voltage state.

5. A content addressable memory that comprises an array of CAM that comprises an array of CAM cells, the array comprising:
a plurality of word lines, each word line being associated with a corresponding row of CAM cells in the array;
a plurality of match lines, each match line being associated with a corresponding row of CAM cells in the array;
a plurality of bit line pairs, wherein each bit line pair associated with a corresponding column of CAM cells in the array and includes a first bit line and a second bit line, wherein each CAM cell comprises:
a first non-volatile device having a control gate coupled to the word line that is associated with the row containing the CAM cell, a drain coupled to the first bit line from the bit line pair that is associated with the column containing the CAM cell, and a source coupled to the match line that is associated with the row containing the CAM cell; and
a second non-volatile device having a control gate coupled to the word line that is associated with the row containing the CAM cell, a drain coupled to the second bit line from the bit line pair that is associated with the column containing the CAM cell, and a source coupled to the match line that is associated with the row containing the CAM cell;
the content addressable memory further comprising:
erase control circuitry coupled to the array, the erase circuitry controlling an erase operation that erases a row of the array; and
bit line drivers coupled to the bit lines of the array, the bit line drivers biasing the bit lines of the array for a search, wherein the content addressable memory permits the search during an erase operation.

6. The content addressable memory of claim 5, further comprising a content addressable buffer for temporarily storing a word to be written to the array of non-volatile memory cells, wherein the content addressable buffer performs a search when the bit line drivers bias the bit lines for a search.

7. A content addressable memory that comprises an array of CAM cells, the array comprising:
a plurality of word lines, each word line being associated with a corresponding row of CAM cells in the array;
a plurality of match lines, each match line being associated with a corresponding row of CAM cells in the array;
a plurality of bit line pairs, wherein each bit line pair associated with a corresponding column of CAM cells in the array and includes a first bit line and a second bit line, wherein each CAM cell comprises:
a first non-volatile device having a control gate coupled to the word line that is associated with the row containing the CAM cell, a drain coupled to the first bit line from the bit line pair that is associated with the column containing the CAM cell, and a source coupled to the match line that is associated with the row containing the CAM cell;
a second non-volatile device having a control gate coupled to the word line that is associated with the row containing the CAM cell, a drain coupled to the second bit line from the bit line pair that is associated with the column containing the CAM cell, and a source coupled to the match line that is associated with the row containing the CAM cell;
a third non-volatile device having a control gate coupled to a second word line that is associated with the row containing the CAM cell, a drain coupled to the first bit line from the bit line pair that is associated with the column containing the CAM cell, and a source coupled to the match line that is associated with the row containing the CAM cell; and
a fourth non-volatile device having a control gate coupled to the second word line that is associated with the row containing the CAM cell, a drain coupled to the second bit line from the bit line pair that is associated with the column containing the CAM cell, and a source coupled to the match line that is associated with the row containing the CAM cell.

8. A content addressable memory comprising:
an array of non-volatile CAM cells, the array being able to simultaneously erase a word stored in the array and search other words in the array for a match to an input value; and
a content addressable buffer connected to temporarily store a word to be written in the array, wherein the content addressable buffer performs a search when the array is erasing one word and searching other words.

9. The content addressable memory of claim 8, wherein the content addressable buffer comprises volatile CAM cells.

10. The content addressable memory of claim 9, wherein the volatile CAM cells comprise SRAM-based CAM cells.

11. The content addressable memory of claim 8, wherein the array is able to simultaneously program a word in the array and search other words in the array for a match to the input value.

12. A content addressable memory comprising an array of CAM cells arranged in rows and columns, wherein:
each row of CAM cells has an associated word line and an associated match line;
each column of CAM cells has an associated first search line; an associated second search line; an associated first programming line; an associated second programming line; and
each CAM cell comprises
a first shared-floating-gate device having a control gate coupled to the word line associated with the row containing the CAM cell, a first drain coupled to the first search line associated with the column containing the CAM cell, a second drain coupled to the first programming line associated with the column containing the CAM cell, and a common source coupled to the match line associated with the row containing the CAM cell; and
a second shared-floating-gate device having a control gate coupled to the word line associated with the row containing the CAM cell, a first drain coupled to the second search line associated with the column containing the CAM cell, a second drain coupled to the second programming line associated with the column containing the CAM cell, and a common source coupled to the match line associated with the row containing the CAM cell.

13. The content addressable memory of claim 12, further comprising a column control circuit capable of biasing the first and second programming lines of the array for writing a word in a first row of the array while biasing the search lines of the array for a search of other rows of the array.

14. A method for operating a content addressable memory, comprising:
temporarily storing a first word in a CAM buffer;
beginning an erase operation to erase a second word that is stored in an array of a non-volatile CAM cells;
searching words in the array other than the second word for a match with an input value, the searching being during the erase operation;
searching the CAM buffer for a match with the input value;
outputting a result of searching the words in the array and searching the CAM buffer; and
writing the first word in the CAM buffer after completion of the erase operation, the first word being written where the second word was stored.

15. The method of claim 14, wherein searching the array and searching the CAM buffer are simultaneous.

16. A method for operating a content addressable memory, comprising:
storing a word in a set of CAM cells, wherein each CAM cell comprises a first pair of non-volatile memory cells and a second pair of non-volatile memory cells, and wherein for each CAM cell said storing comprises:
setting the first pair to indicate a binary value "0" or "1" depending on a corresponding bit in the word being stored; and
setting the second pair to indicated a ternary value "0", "1", or "don't care" depending on a corresponding bit in the word being stored and whether the bit is to be masked;
performing searches without masking in which searching uses only the first pair of non-volatile memory cells in each CAM cell; and
performing searches with masking in which searching uses only the first pair of non-volatile memory cells in each CAM cell.

17. The method of claim 16, wherein when the second pair of non-volatile memory cells in a first CAM cell indicates "don't care", the method further comprises:
reading the first pair of non-volatile memory cells in the first CAM cells to determine the bit stored in the first CAM cell;
setting the second pair to indicated a ternary value "0" or "1" depending on the bit read.

* * * * *